United States Patent
So et al.

[19]

[11] Patent Number: 5,960,275
[45] Date of Patent: Sep. 28, 1999

[54] POWER MOSFET FABRICATION PROCESS TO ACHIEVE ENHANCED RUGGEDNESS, COST SAVINGS, AND PRODUCT RELIABILITY

[75] Inventors: Koon Chong So, San Jose; Fwu-Iuan Hshieh, Saratoga, both of Calif.

[73] Assignee: MageMOS Corporation, San Jose, Calif.

[21] Appl. No.: 08/738,544

[22] Filed: Oct. 28, 1996

[51] Int. Cl.$^6$ ................................. H01L 21/8238
[52] U.S. Cl. ................. 438/211; 438/212; 438/217; 438/289; 257/328; 257/335
[58] Field of Search ................. 438/211, 212, 438/217, 289; 257/328, 335

[56] References Cited

U.S. PATENT DOCUMENTS

| | | | |
|---|---|---|---|
| 5,198,387 | 3/1993 | Tang | 438/684 |
| 5,528,063 | 6/1996 | Blanchard | 257/335 |

OTHER PUBLICATIONS

Wolf et al., Silicon Processing for the VLSI Era: vol. 1—Process Integration, pp. 518, 285, 307–308, 219–220, 290, 184, 1986.

*Primary Examiner*—Richard A. Booth
*Assistant Examiner*—John Murphy
*Attorney, Agent, or Firm*—Bo-In Lin

[57] ABSTRACT

This invention shows an improved method for fabricating a MOSFET transistor on a substrate to improve a device ruggedness. The method includes the steps of: (a) forming an epi-layer of a first conductivity type as a drain region on the substrate and then growing an initial oxide layer over the epi-layer; (b) applying an active mask for etching the initial oxide layer to define an active area and forming a gate oxide layer thereon followed by depositing an overlaying polysilicon layer; (c) applying a poly mask for etching the polysilicon layer to define a plurality of poly gates; (d) removing the poly mask and then carrying out a body implant of a second conductivity type followed by performing a body diffusion for forming a plurality of body regions and for growing a thin oxide layer overlaying the ploy gates and silicon surface; (e) depositing a blocking-and-alignment layer of dielectric material with a pre-designated thickness followed by implanting body-dopants of the second conductivity type at an energy level correlating to the thickness of the blocking-and-alignment layer to form a buried body-dopant region at a pre-determined depth in each of the body regions (f) removing the blocking-and-alignment layer followed by applying a source blocking mask for implanting a plurality of source regions in the body regions with ions of the first conductivity type followed by removing the source blocking mask; and (g) forming an insulation layer and applying a high temperature process for densification of the insulation layer and further for actuating a diffusion of the source regions and the deep heavily-doped body-dopant regions. The deep heavily-doped body-dopant regions are formed immediately below the source regions whereby the device ruggedness is improved.

12 Claims, 9 Drawing Sheets

process with double implanted n/n$^+$ -emitter

POWER MOSFET FABRICATION PROCESS TO ACHIEVE ENHANCED RUGGEDNESS, COST SAVINGS, AND PRODUCT RELIABILITY

BACKGROUND OF THE INVENTION

1. Field of the Invention

This invention relates generally to the structure and fabrication process of power MOSFETs. More particularly, this invention relates to a novel, improved, and simplified process for fabricating a power MOSFET device at lower cost wherein heavily doped p$^+$ regions buried underneath the n$^+$ doped source regions are provided to reduce the body-to-source resistance $R_{bs}$ for preventing an incidental turning on of the parasitic NPN bipolar such that the device ruggedness is improved.

2. Description of the Prior Art

Manufacture of power MOSFET transistors still experiences the difficulties of product reliability and high fabrication costs. These difficulties are caused by a manufacture process for the purpose of increasing the device ruggedness. In order to achieve this goal, a more complicated process, involving the formation of spacer, is applied which employ oxide spacers to form the self aligned buried regions underneath the source regions with higher body-dopant concentration. In carrying out the processing steps to form these oxide spacers, a special anisotropic etching process, e.g., a reactive ion etching (RIE), process is performed which often leads to special problems and limitations in manufacturing the power device. Leakage of the junction currents, directly below the space edges is often reported in devices formed with oxide spacer. The problems can be attributed to silicon loss and spacer etch damages in the substrate which also lead to defects formed in the subsequent source implant and anneal. The performance of the power device and the reliability are therefore adversely affected due to these difficulties when spacers are implemented which are formed with these processing steps.

Various internal parasitic components often impose design and performance limitations on a conventional power metal oxide silicon field effect transistor (MOSFET) structure and processing steps of fabrication for manufacturing a MOSFET transistor. Among these parasitic components, special care must be taken in dealing with a parasitic npn bipolar junction transistor (BJT) formed between the source, the body, and the drain. Under static conditions the base and emitter of the parasitic BJT are shorted, leaving only the body-drain diode effective. However, under transient conditions and in avalanche breakdown, the parasitic BJT may be incidentally activated which can seriously degrade the overall performance of the MOSFET. Under the circumstances when the parasitic bipolar junction transistor is incidentally activated, snap back may occur which can cause permanent damages to the device. For this reason, precaution must be taken to increase the ruggedness of the device by taking into account that an incidental activation of the parasitic BJT should be prevented in an avalanche breakdown condition when large amount of hole current is generated in the core cell area.

Figure 1:
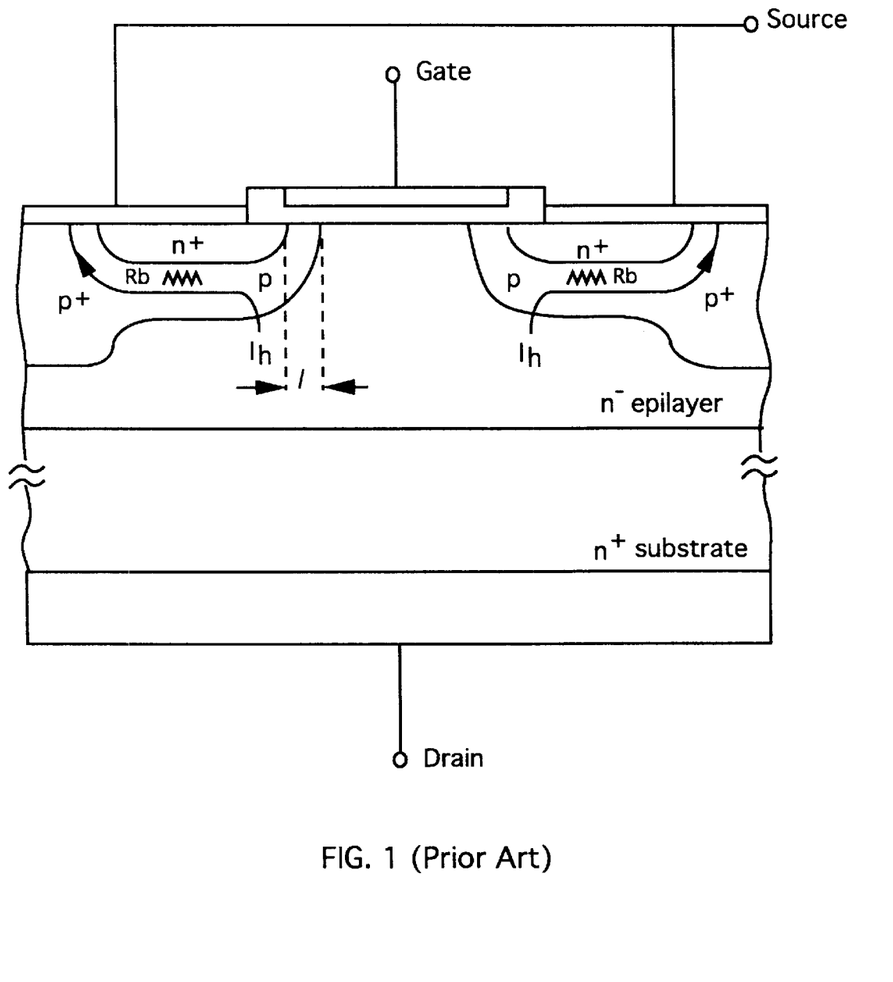
FIG. 1 is a cross-sectional view of a prior art structure of a general MOSFET.

In order to better understand the design issues related to device ruggedness encountered in the prior art, general descriptions for the structure of a conventional power MOSFET device and design issues relating to device ruggedness are first discussed. FIG. 1 shows a typical vertical double-diffused MOS (VDMOS) device which uses a double diffusion technique to control the channel length 1. Two successive diffusions are performed with first a p diffusion using boron, then a n diffusion using either arsenic or phosphorus, to produce two closely spaced pn junctions at different depths below the silicon surface. With this pn junction, as shown in FIG. 1, the VDMOS supports the drain voltage vertically in the n$^-$ epilayer. The current flows laterally from the source through the channel, parallel to the surface of the silicon. The current flow then turns through a right angle to flow vertically down the drain epilayer to the substrate and to the drain contact. The p-type "body" region in which the channel is formed when a sufficient positive voltage is applied to the gate and the channel length can be controlled through the processing steps. Because of the relative doping concentrations in the diffused p-channel region and the n- layer, the depletion layer which supports $V_{DS}$, a drain to source voltage, extends down into the epilayer rather than laterally into the channel. Under the circumstances of avanlanche breakdown, a hole current, i.e., $I_h$ as shown in FIG. 1, is generated to flow from the breakdown region to the source. A voltage drop, $I_h R_b$, is generated over the parasitic NPN bipolar junction transistor as the hole current $I_h$ is transmitted via the p-body region which has a p-body resistance $R_b$. When this voltage drop across this parasitic bipolar junction transistor reaches a certain level, the parasitic bipolar transistor is turned on. Activation of the parasitic bipolar transistor, as discussed above, could cause snap-back and permanent damages to the MOSFET device.

Figure 2:
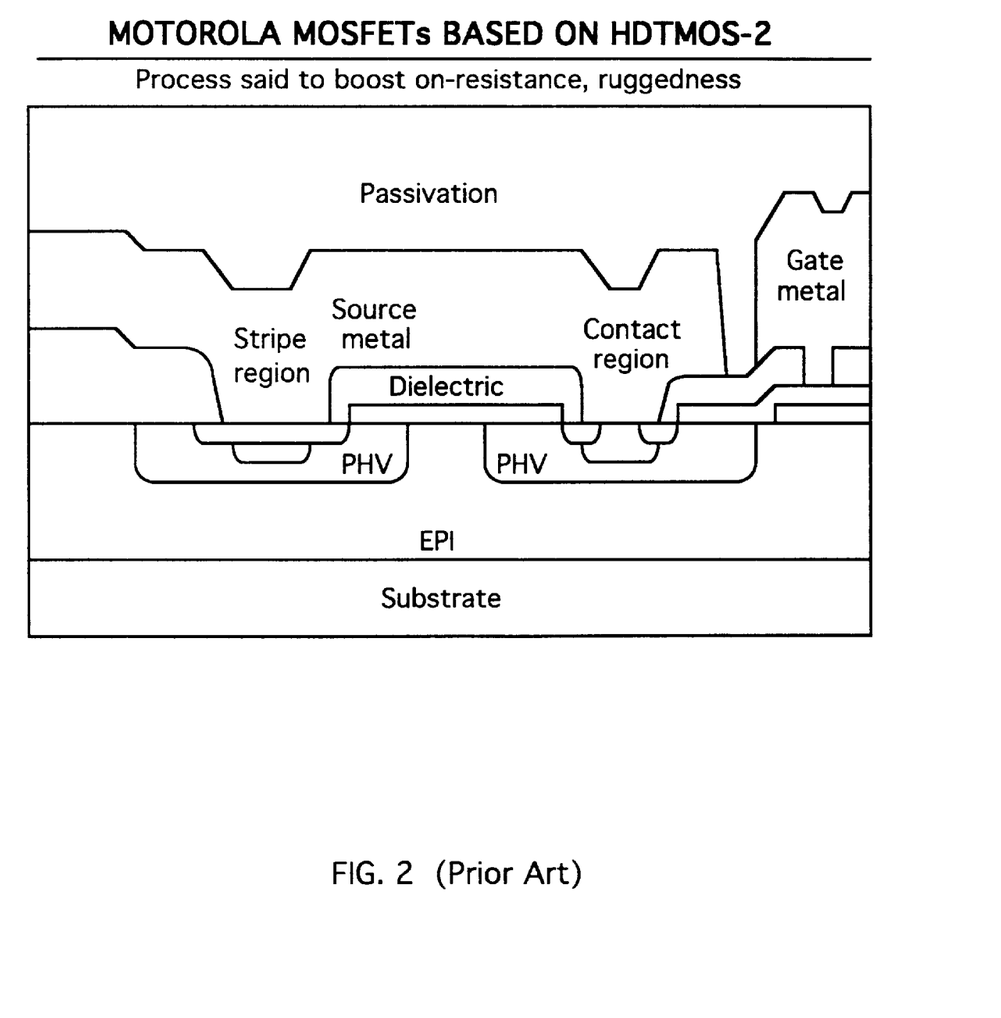
FIGS. 2 is a cross sectional view of a prior art MOSFET structure implemented with dielectric layer as spacer to reduce the source width and to improve the device ruggedness.

For the purpose of improving the device ruggedness, Motorola discloses a HDTMOS-2 structure as that shown in FIG. 2 (please refer to Electronic Engineering Times, Apr. 8, 1996, Page 78). After n$^+$ source impant, a dielectric layer is grown on top of the polysilicon gate. The dielectric layer is applied as a spacer for boron implant blocks, automatically self aligned with the source regions. This heavily doped p$^+$ region underneath the source region can reduce the body to source resistance $R_b$ in the p-body region thus decreasing the voltage drop $I_h R_b$ whereby the ruggedness of the MOSFET device is improved.

The difficulties arising from spacer implementation, such as the structure discussed above, can be better understood from a brief review of a typical spacer formation processes. In order to fabricate side-wall spacers on the edge of a poly gate, a conformal CVD oxide layer is deposited. A preferred method is to decompose TEOS at 725° C. to form a layer with excellent conformality. The layer tends to have greater thickness along the vertical edges of poly gates then on the flat areas. An anisotropic etch process will remove the oxide in the flat areas while leaving the spacers at the side walls of the poly gates. In order to account for variations in the spacer oxide layer thickness, some over etch is necessary. During the over-etch time, the field oxide and the silicon in the source or body junction regions may also be etched. Which may lead to the problems and difficulties discussed above. Furthermore, the uniformity of the RIE process is difficult to control and the slope of the spacer may vary along the side-walls of the poly gates. Which may then affect the self alignment and dopant profiles in subsequent ion implant operations to form the buried body-regions and the source regions. These difficulties in applying the RIE process cannot be easily resolved when the spacers are employed.

Figure 3:
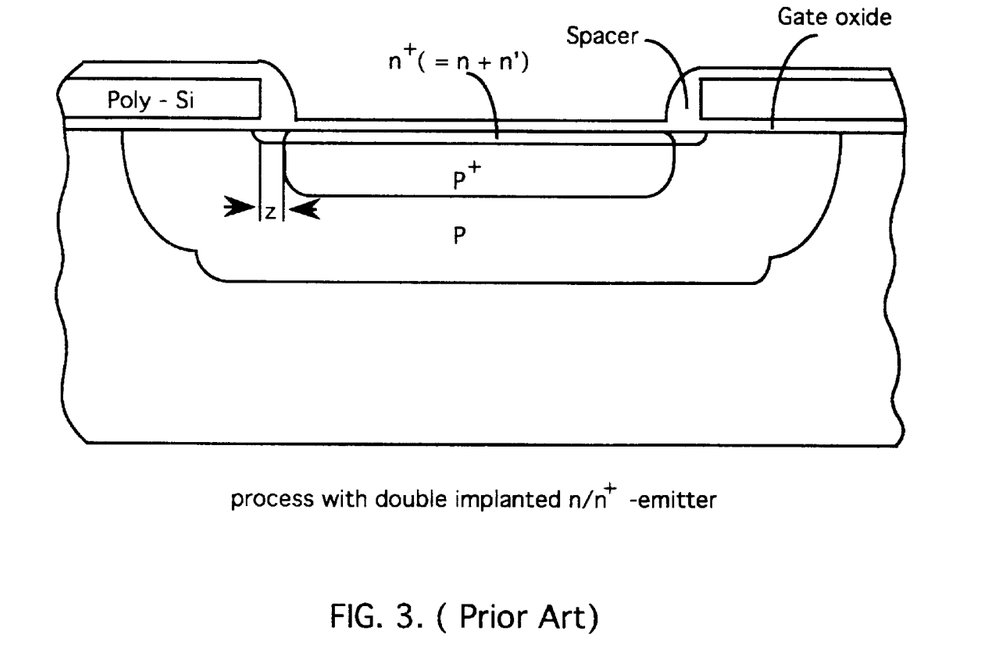
FIGS. 3 is a cross-sectional view of another prior art MOSFET structure with a spacer formed by dry etching for implant into a heavily doped body region underneath the source to improve the device ruggedness.

In a paper published by Laska et al. entitled "A Low Loss/Highly Rugged IGBT-Generation-Based on a Self Aligned Process with Double Implanted N/N+ Emitter" (Proc. of the 6th Internat. Symposium on Power Semiconductor Device & IC's, Davos, Switzerland May 31–Jun. 2, 1994, PP 171–172), a new V-IGBT chip is disclosed. In order to realize a cell design for low on-state voltage in combination with high ruggedness, special cell structure is implemented. The cell structure is manufactured by applying the steps that after an isotropic etching of the polysilicon gate and after the p-well diffusion a first implant is carried out with one special part, e.g., n-implant, of the total emitter dose. Then an oxide spacer of a width of approximately 0.5 μm is produced. Using this oxide spacer, a self aligned implant of the highly doped p+ well extremely close to the beginning of the channel is carried out. Then the second emitter implant, e.g., n-implant, follows using the same oxide spacer. Thus the emitter is formed with a double implant. In the critical area near the source contact, without the p+ doping, the parasitic emitter efficiency is adjusted by a low implant dose. Inside the less critical area in the body, the high dose is present which is necessary for the ohmic-Si/metal contact where the parasitic emitter efficiency is reduced by the p+ well. Laska et al. disclose a structure and fabrication method to increase device ruggedness by the use of oxide spacer as that shown in FIG. 3. Such fabrication processes require more processing steps. The product reliability may be adversely affected by the more complicated fabrication processes and the costs of device production are also increased due to the requirement of applying the spacer.

In order to reduce the body to source resistance, Korman et al. disclosed in U.S. Pat. No. 5,119,153 entitled "Small Cell Low Contact Resistance Rugged Power Field Effect Devices and Method of Fabrication" (issued on Jun. 2, 1992), a power field effect semiconductor device wherein an oxide or nitride spacer is used to form a heavily doped portion of a body region which is self aligned with respect to an aperture in the gate electrode. In forming the spacer, the nitride or oxide layer has to be formed and then anisotropically etched by reactive ion etching (RIE) in order to form the space along the side wall of the poly silicon gate. Therefore, the device disclosed by Korman et al. is faced with the same technical difficulties associated with an-isotropic etching, such as an RIE process, as discussed above. Difficulties in manufacturability arising from imprecision of process control in applying this RIE method may also cause the cost of production to increase.

Therefore, there is still a need in the art of power device fabrication, particularly for power MOSFET design and fabrication, to provide a simplified and improved fabrication process that would resolve these limitations.

SUMMARY OF THE PRESENT INVENTION

It is therefore an object of the present invention to provide an improved MOSFET fabrication process to overcome the aforementioned difficulties and limitations encountered in the prior art.

Specifically, it is an object of the present invention to provide an improved MOSFET fabrication process wherein a deep heavily doped body region is formed underneath the source regions for device ruggedness improvement without requiring the use and formation of a spacer such that the fabrication processes are simplified.

Another object of the present invention is to provide an improved MOSFET fabrication process wherein a deep heavily doped body region is formed underneath the source regions for improving the device ruggedness with simplified manufacture processing steps without requiring the use of a spacer such that the cost savings for device production are achieved.

Briefly, in a preferred embodiment, the present invention discloses an improved method for fabricating a MOSFET transistor on a substrate to improve a device ruggedness. The method includes the steps of: (a) forming an epi-layer of a first conductivity type as a drain region on the substrate and then growing an initial oxide layer over the epi-layer; (b) applying an active mask for etching the initial oxide layer to define an active area and forming a gate oxide layer thereon followed by depositing an overlaying polysilicon layer; (c) applying a poly mask for etching the polysilicon layer to define a plurality of poly gates; (d) removing the poly mask and then carrying out a body implant of a second conductivity type followed by performing a body diffusion for forming a plurality of body regions and for growing a thin oxide layer overlaying the poly gates and silicon surface; (e) depositing a blocking-and-alignment layer of dielectric material with a pre-designated thickness followed by implanting body-dopants of the second conductivity type at an energy level correlating to the thickness of the blocking-and-alignment layer to form a buried body-dopant region at a pre-determined depth in each of the body regions (f) removing said blocking-and-alignment layer followed by applying a source blocking mask for implanting a plurality of source regions in the body regions with ions of the first conductivity type followed by removing the source blocking mask; and (g) forming an insulation layer and applying a high temperature process for densification of the insulation layer and further for actuating a diffusion of the source regions and the deep heavily-doped body-dopant regions wherein the deep heavily-doped body-dopant regions are formed immediately below the source regions whereby the device ruggedness is improved.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 4A:
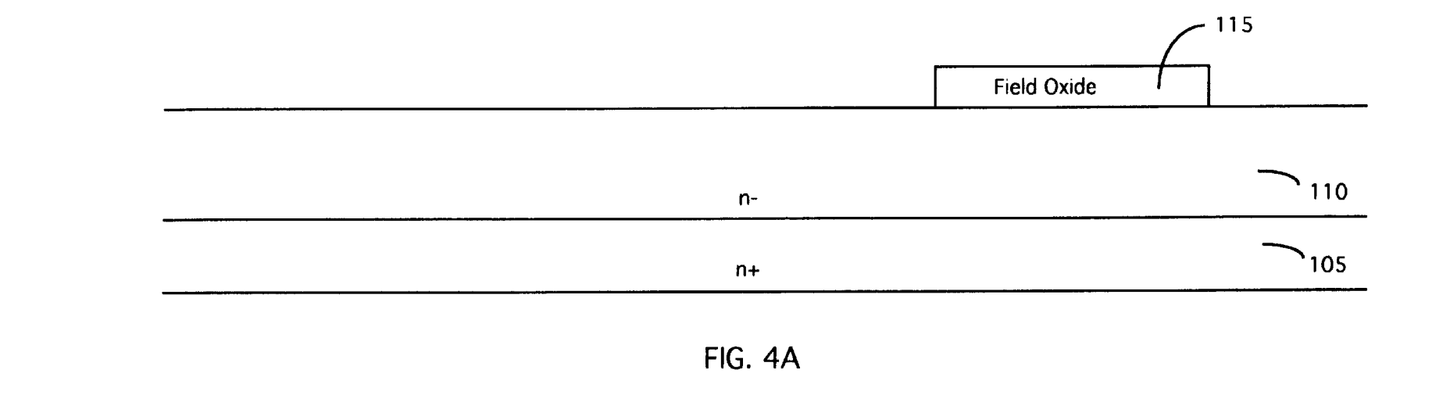
FIGS. 4A to 4E show the processing steps for manufacturing a MOSFET device according to the present invention with a deep heavily doped body-region formed underneath the source region without requiring the use of a spacer.
Figure 4B:
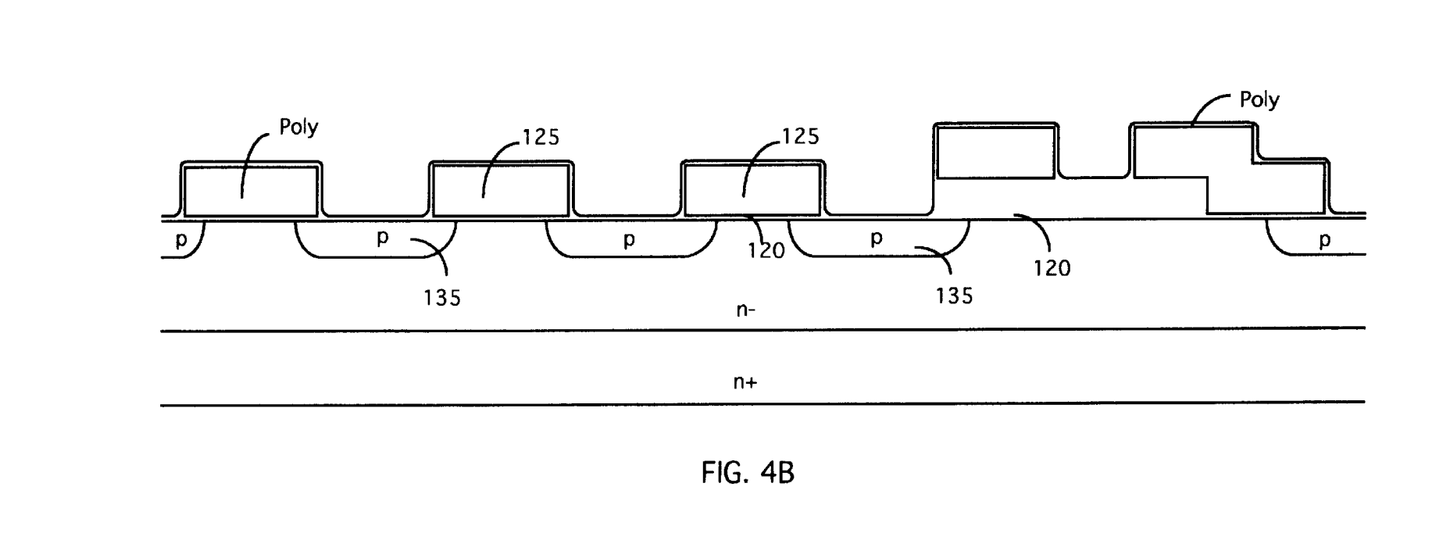

The novel and improved processing steps for manufacturing a power MOSFET device to achieve increased device ruggedness according to the present invention are illustrated in FIGS. 4A to 4D. As shown in FIG. 4A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the requirements for device on-resistance and breakdown voltage. In a preferred embodiment, the thickness of the epi-layer 110 is about six to eight microns (6–8 $\mu$m). An initial oxide layer 115 of thickness in the range of 5,000 to 10,000 Å is grown which is then etched by applying an active mask to define the active areas. Referring to FIG. 4B, a gate oxidation process is first carried out to form a gate oxide layer 120. A polysilicon layer 125 is then deposited on the gate oxide layer 120. A $POCL_3$ doping process is carried out followed by an As-implant process with an ion beam of energy at 60–80 Kev with a flux density of 5 to $8 \times 10^{15}/cm^2$ A poly mask is then applied to carry out the an-isotropic etching process to define the poly gate 125. The resist is stripped and a p-body implant at 30–100 Kev with an ion beam of $3 \times 10^{13}$ to $3 \times 10^{14}/cm^2$ flux density to form the p-body region 135. A p-body diffusion process is then carried out at an elevated temperature of 1,000–1,200° C. for ten minutes to three hours to increase the depth of the p-body region 135 to 1.0–2.0 $\mu$m.

Figure 4C:
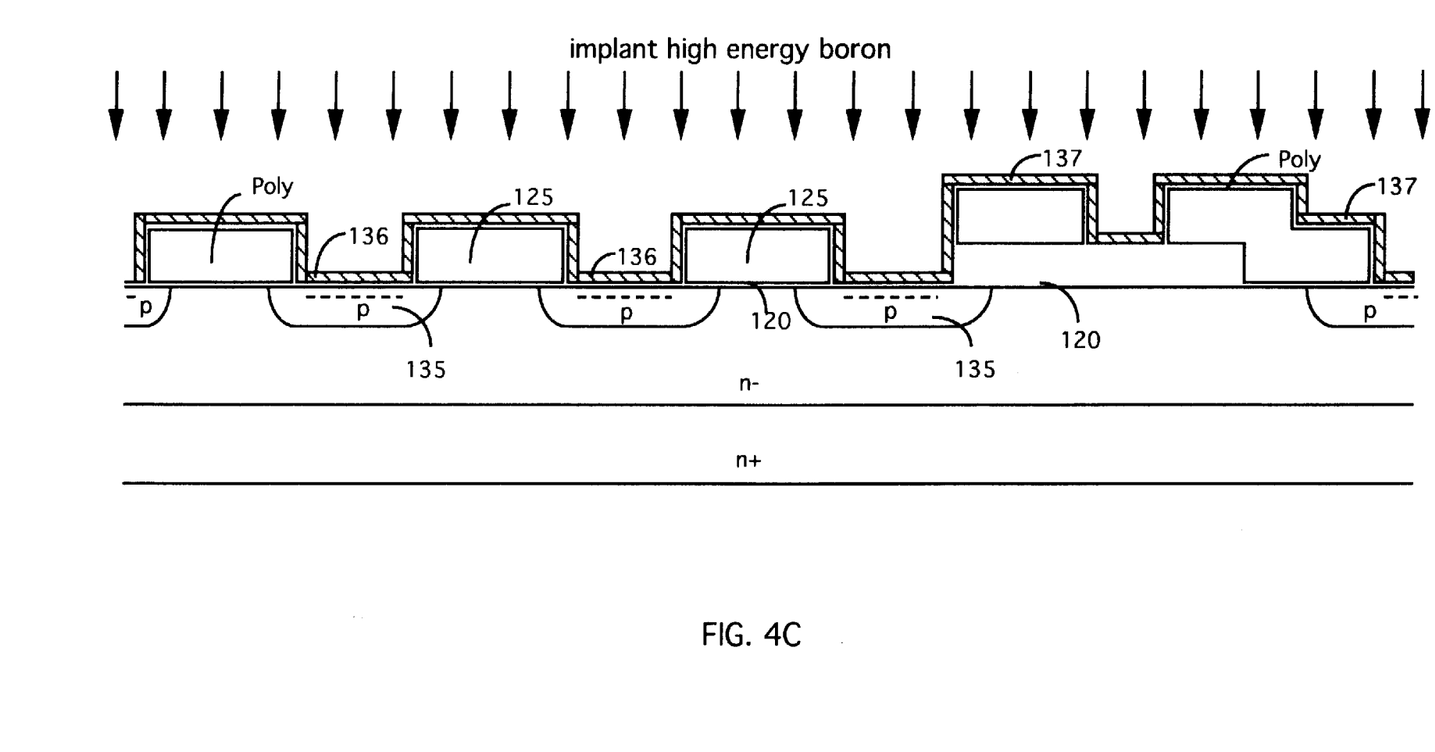
Figure 6:
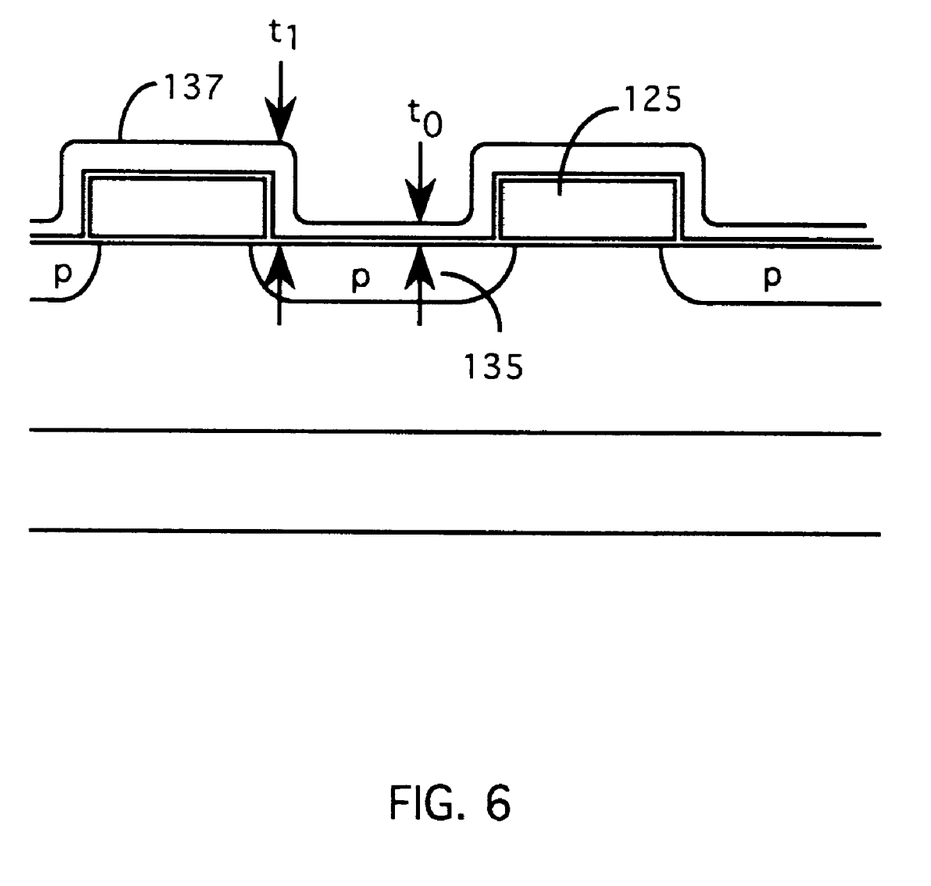
FIG. 6 illustrate the variation of thickness of a uniformly deposited layer along the edge of the poly gates and on the surface between the gates for the purpose of implanting a buried body region with self-alignment and blocking effects.

Referring to FIG. 4C an silicon dioxide layer 137 with a layer thickness of 1000 to 3500 Å is deposited. Several methods can be applied for the deposition of silicon oxide layer 137 at either high or low temperatures. In a preferred embodiment, the silicon dioxide layer 137 is deposited at 650 to 750° C. by a low pressure chemical vapor deposition (LPCVD) process where a compound tetraethoxysilane $Si(OC_2H_5)_4$ is decomposed, this compound is also referred to as tetraethyl orthosilicate and abbreviated as TEOS,. This TEOS compound is vaporized from a liquid source and silicon dioxide is produced to deposit a silicon dioxide layer 137. The TEOS deposition process provides excellent uniformity with precise thickness control and good film properties. It is to be noted that this deposition layer 137 of silicon dioxide is formed with greater thickness along the side-walls of the gate 125, i.e., near the corners 136. The greater thickness near the corner 136 can be easily understood by referring to FIG. 6. For a preferred embodiment, if the regular thickness of the silicon dioxide layer 137 is 2000 Å, because of the particular geometry near the corners 136, the thickness of the silicon oxide layer 137 near the corners is 7000 Å which is the sum of the thickness of the poly gate, e.g., 5000 Å and the thickness of the oxide layer 2000 Å.

Figure 4D:
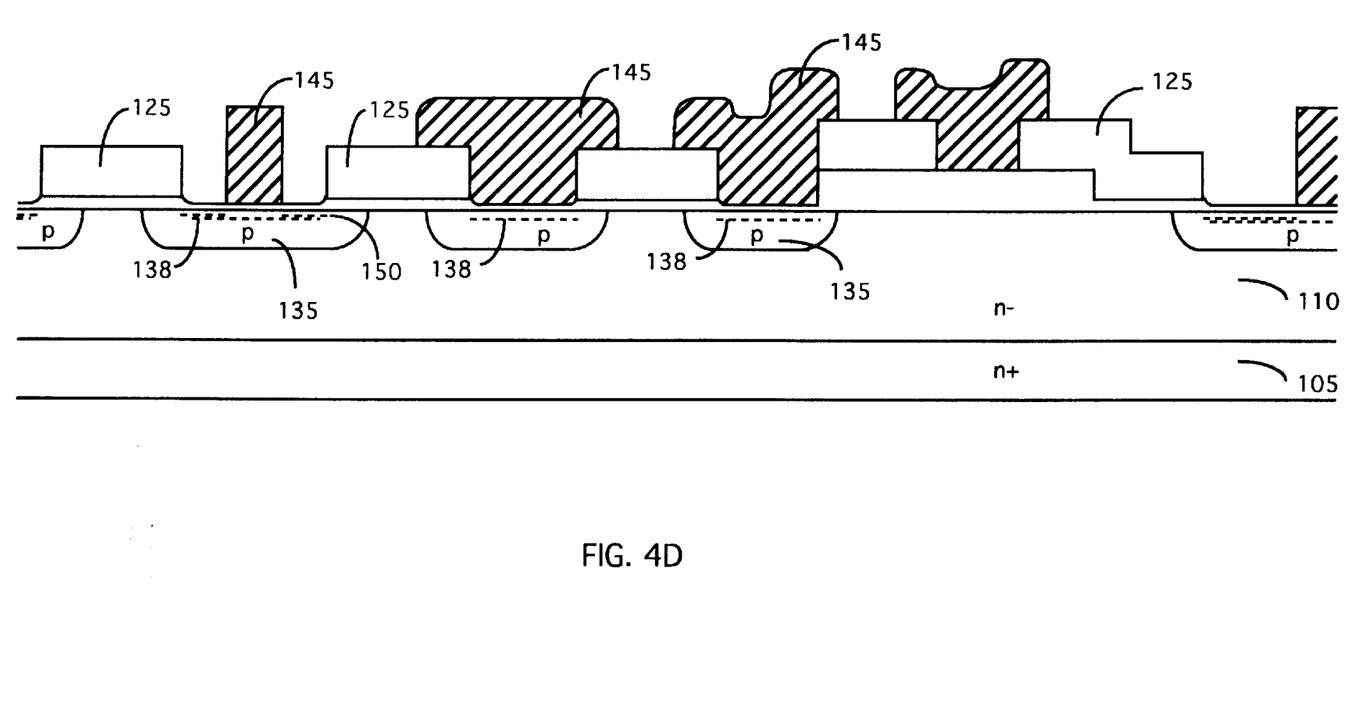
Figure 5:
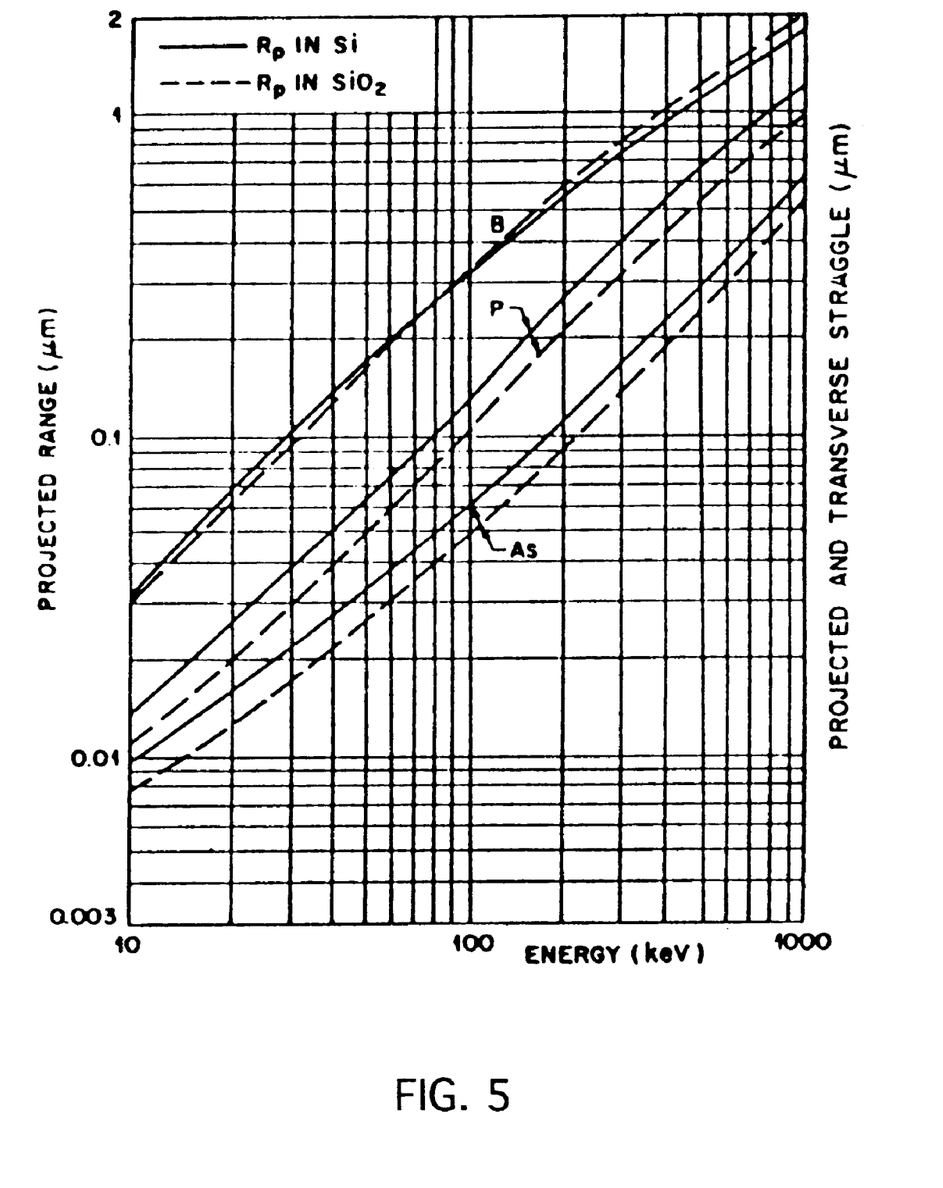
FIGS. 5 show a correlation between the projected depths of ion implant as a function of ion energy when blocked by silicon and silicon dioxide layers.

Referring to FIG. 4D, a boron implant with ion flux of $5 \times 10^{13}$ to $1 \times 10^{16}$ /$cm^2$ is carried out with an ion beam at a suitable energy range, e.g., an energy ranging from 80 to 250 Kev, to form a deep heavy-doped $p^+$ region 138. In forming the buried $p^+$ region 138, the deposition layer 137 servers two functions. First, the deposition layer 137 which has a thickness of approximately 1000 to 3500 Å is employed to control the depth of the boron implant and also the distance of the buried body region 138 from the edge of the p-body region 135. Referring to FIG. 5, a well defined correlation exists between the depth of the implant region and the thickness of the silicon oxide layer 137. Because the thickness of the deposition layer 137 can be precisely controlled, the depth of the implant region 138 can also be controlled by varying the energy of the implant ions according to the desired depth and the thickness of the silicon dioxide layer 137. Secondly, because of its greater thickness near the comers 136, the deposition layer 137 servers as built-in alignment spacer, to block the implanting boron ions in forming the buried body region 138. The boron ions implanted into the region are blocked by the alignment spacer formed near the corner 136 and are prevented from entering into the peripheral portions of the p-body region thus the boron ions are blocked and do not laterally diffuse into the edge of the p-body regions. The buried regions 138 are therefore aligned and laterally limited to the central portions between the poly gate 125 with a controllable distance from the edge of the p-body 135. An oxide layer etching is then carried out to remove the deposition layer 137 of silicon dioxide. Compared to the process of forming the alignment spacers by etching a portion of the oxide layer by an an-isotropic etch process commonly implemented in the prior art, the deposition of the oxide layer 137 provides a further advantage that the removal of this deposition layer is easier and can be accomplished with much cleaner and more defect-free surface after the removal process.

A $N^+$ block mask 145 is applied for carrying out the $N^+$ implantation, preferably with arsenide ions (As), with an ion beam at an energy of 60–100 Kev and ion flux density of $5 \times 10^{15}$ to $1 \times 10^{16}/cm^2$ to form the N+ region 150. After the resist, i.e., the $N^+$ blocking mask 145, is stripped, the $N^+$ source regions 150 together with the deep $p^+$ region 138 are driven into desired junction depth by a diffusion process. The source regions 150 are driven to a depth ranging from 0.2 to 0.6 $\mu$m and the deep $p^+$ regions 138 are driven below the source regions 150 to a depth ranging from 0.6 to 1.0 $\mu$m underneath the source regions 150.

Figure 4E:
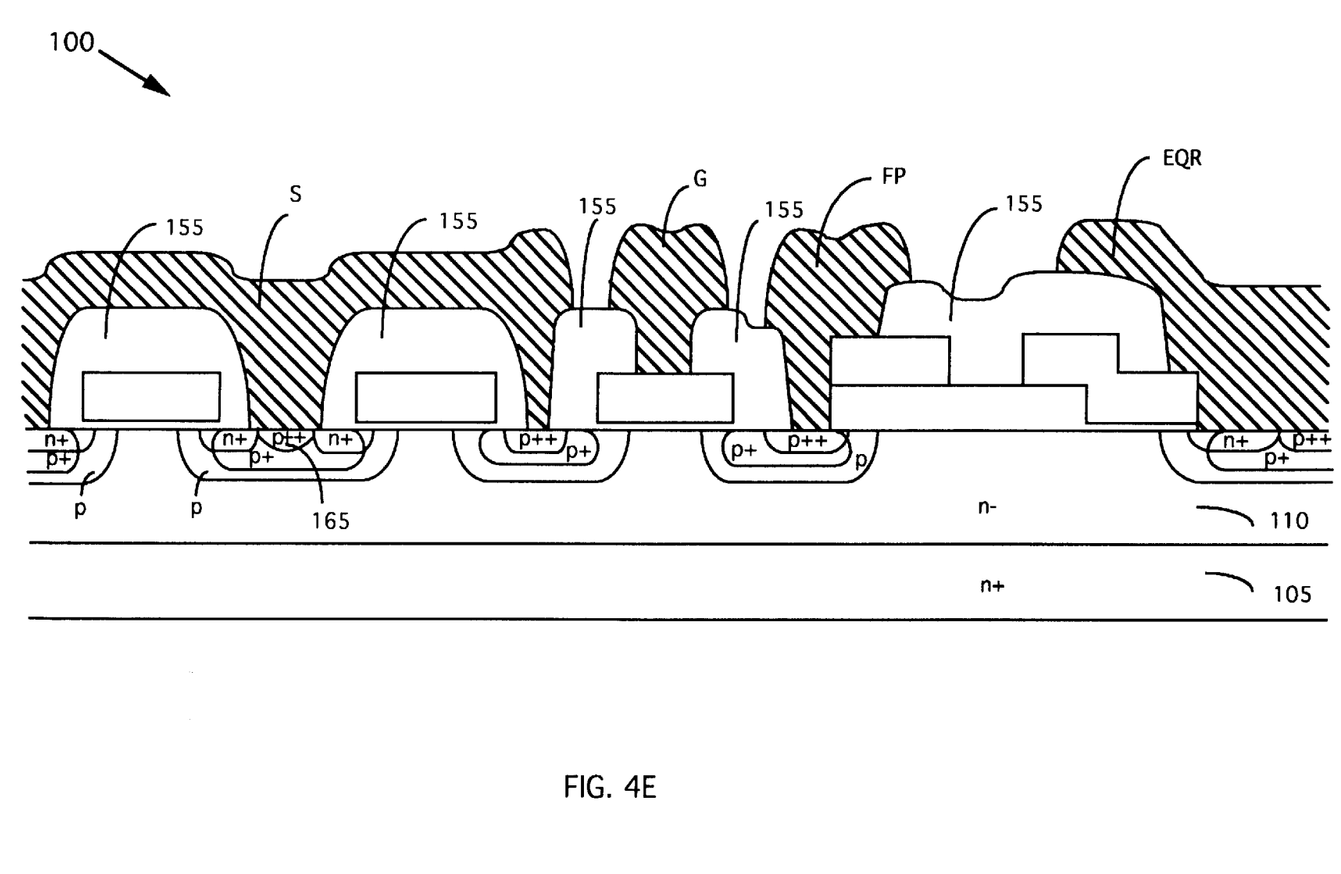

Referring to FIG. 4E, a BPSG or PSG is deposited to form a layer 155 of approximately 5000–15,000 Å in thickness. A BPSG flow or PSG densification process is performed at 900–950° C. for thirty minutes to one hour. A contact mask is applied to perform an etching process to define the contacts. A p+ ion implantation is carried out, with boron at 30–60 Kev having an flux density of $10^{15}$ to $5 \times 10^{15}/cm^2$, to form the p++ region 165 by a p+ activation process at 900–950° C. in an oxidation or inert gas ambient. The final power MOSFET device 100 is completed with the metal deposition and metal etching with a metal mask to define the source contact, the gate contacts, the field plate and equal potential ring (EQR) and since these metal contacts are well known in the art and since they are not the major features of the invention, these metal contacts are not shown for sake of simplicity.

In addition to a deposition layer 137 of silicon dioxide, this deposition layer may be a layer of different dielectric materials, e.g., silicon nitride, $Ta_2O_5$, polysilicon, etc. As that shown in FIG. 5, the depths of the implanted boron ions can be controlled by varying the energy level of the implant the boron ions. The present invention further provides an advantage that the implant to the buried body regions and the drive-in process to increase the depth of the buried body-dopant regions are performed prior to the implant of the source regions and furthermore that the buried body region is formed underneath source regions with greater depth. In a subsequent diffusion process, the buried body regions are diffused right underneath the source region to provide enhanced ruggedness for the power MOSFET device.

In summary, the present invention discloses an improved method for fabricating a MOSFET transistor 100 on a substrate 105 to improve a device ruggedness. The method includes the steps of: (a) forming an epi-layer 110 of a first conductivity type as a drain region on the substrate 105 and then growing an initial oxide layer over the epi-layer; (b) applying an active layer for etching the initial oxide layer to define an active area and forming a gate oxide layer 120 thereon followed by depositing an overlaying polysilicon layer 125; (c) applying a poly mask for etching the polysilicon layer to define a plurality of poly gates 125; (d) removing the poly mask for carrying out a body implant of a second conductivity type followed by performing a body diffusion for forming a plurality of body regions 135 and for growing a thin oxide layer overlaying the poly gates 125 and the silicon surface; (e) depositing a blocking-and-alignment layer 137 of dielectric material with a pre-designated thickness followed by implanting body-dopants of the second conductivity type at an energy level correlating to the thickness of the blocking-and-alignment layer to form a buried body-dopant region 138 at a pre-determined depth in each of the body regions 135 (f) removing said blocking-and-alignment layer 137 followed by applying a source blocking mask 145 for implanting a plurality of source regions 150 in the body regions 135 with ions of the first conductivity type followed by removing the source blocking mask 145; and (g) forming an insulation layer 155 and applying a high temperature process for densification of the insulation layer 155 and further for actuating a diffusion of the source regions 150 and the deep heavily-doped body-dopant regions 138 wherein the deep heavily-doped body-dopant regions 138 are formed immediately below the source regions 150 whereby the device ruggedness is improved. In a preferred embodiment, the step of forming a blocking and alignment layer 137 is a step of forming a silicon dioxide layer of thickness ranging from 1000 to 3500 Å.

Therefore, improved MOSFET fabrication processes are provided in the present invention to overcome the difficulties and limitations encountered in the prior art. Specifically, an improved MOSFET fabrication process is provided wherein a deep heavily doped body-dopant region is formed underneath the source regions for device ruggedness improvement without requiring the use of a spacer such that the fabrication processes are simplified. By employing the simplified MOSFET fabrication process to produce an improved cell structure with a deep heavily doped body-dopant region formed underneath the source regions for device ruggedness improvement without requiring the use of a spacer, cost savings for device production are also achieved. Power MOSFET transistors of better quality and improved reliability are manufactured because the use of the deposition layer of silicon dioxide as the blocking and alignment. The uniformity and quality of the deposition layer can be precisely controlled. Furthermore, compared to the spacer formed by etching a portion of the oxide layers by an RIE process, the deposition layer, as disclosed in the present invention for the purpose of forming the buried body-dopant regions, can be more conveniently removed to provide cleaner and more defect-free surface to enhance the quality and reliability of the products manufactured by this improved method.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. An improved method for fabricating a MOSFET transistor on a substrate to improve a device ruggedness comprising steps of:

(a) forming an epi-layer of a first conductivity type as a drain region on said substrate and then growing an initial oxide layer over said epi-layer;

(b) applying an active mask for etching said initial oxide layer to define an active area and forming a gate oxide layer thereon followed by depositing an overlaying gate layer;

(c) applying a gate mask for etching said gate layer to define a plurality of gates;

(d) removing said gate mask for carrying out a body implant of a second conductivity type followed by performing a body diffusion for forming a plurality of body regions;

(e) depositing a blocking-and-alignment layer of dielectric materials covering edges of said gates having an edge layer thickness substantially equal to the sum of said gate and said blocking-and-alignment layer and immediately followed by implanting body-dopants of said second conductivity type over said blocking-and-alignment layer between said gates to form a buried body-dopant region in each of said body regions at a predetermined depth followed by removing said blocking-and-alignment layer;

(f) applying a source blocking mask for implanting a plurality of source regions in said body regions with ions of said first conductivity type followed by removing said source blocking mask and subsequent processing steps applying elevated temperature for actuating a diffusion of said source regions and said buried body-dopant regions wherein said buried body-dopant regions are diffused immediately below said source regions and shallower than said body regions whereby said device ruggedness is improved.

2. The method for fabricating a MOSFET transistor of claim 1 wherein:

said step of applying elevated temperature for actuating a diffusion of said source regions and said buried body-dopant regions in said step (f) includes a step of forming an insulation layer and applying a high temperature process for densification of said insulation layer.

3. The method for fabricating a MOSFET transistor of claim 1 wherein:

said step (e) of depositing a blocking-and-alignment layer of dielectric materials and immediately followed by implanting body-dopants of said second conductivity type over said blocking-and-alignment layer between said gates to form a buried body-dopant region in each of said body regions at a predetermined depth is a step of depositing said blocking-and-alignment layer with a predetermined thickness and implanting said body-dopants with an energy corresponding to said predetermined thickness of said blocking-and-alignment layer in order to form said buried body-dopant region at said predetermined depth.

4. The method for fabricating a MOSFET transistor of claim 3 wherein:

said step of depositing said blocking-and-alignment layer with a predetermined thickness and implanting said body-dopants over said blocking-and-alignment layer between said gates with an energy corresponding to said predetermined thickness of said blocking-and-alignment layer in order to form said buried body-dopant region at said predetermined depth is a step of forming said buried body-dopant region at a depth immediately below said source region.

5. The method for fabricating a MOSFET transistor of claim 3 wherein:

said step of carrying out a body implant of a second conductivity type in said step (d) is a step of carrying out said body implant of a p-type dopants to form a n-channel MOSFET transistor;

said step of depositing said blocking-and-alignment layer with said predetermined thickness and implanting said body-dopants over said blocking-and-alignment layer between said gates with an energy corresponding to said predetermined thickness of said blocking-and-alignment layer in order to form said buried body-dopant region at said predetermined depth in said step (e) is a step of depositing a silicon dioxide layer ranging from 1000 to 3500 Angstroms and implanting said body-dopants with boron ions at an energy ranging from 80 to 300 Kev.

6. The method for fabricating a MOSFET transistor of claim 5 wherein:

said step of depositing a silicon dioxide layer ranging from 1000 to 3500 Angstroms in said step (e) is a step of carrying out a deposition process of said silicon dioxide layer with a TEOS compound for precise control of a thickness and providing a highly uniform thickness for said blocking-and-alignment layer.

7. An improved method for fabricating a MOSFET transistor on a substrate to improve a device ruggedness comprising steps of:

(a) forming an epi-layer of a n-type conductivity type as a drain region on said substrate and then growing an initial oxide layer over said epi-layer;

(b) applying an active mask for etching said initial oxide layer to define an active area and forming a gate oxide layer thereon followed by depositing an overlaying gate layer;

(c) applying a gate mask for etching said gate layer to define a plurality of gates;

(d) removing said gate mask for carrying out a body implant of a p-type conductivity type to form a n-channel MOSFET transistor followed by performing a body diffusion for forming a plurality of body regions;

(e) depositing a blocking-and-alignment layer of silicon dioxide layer ranging from 1000 to 3500 Angstroms by employing a TEOS compound for precise control of a thickness and uniformity of said blocking-and-alignment layer, followed immediately by implanting body-dopants over said blocking-and-alignment layer between said gates with boron ions at an energy ranging from 80 to 300 Kev to form a buried body-dopant region in each of said body at a predetermined depth followed by removing said blocking-and-alignment layer;

(f) implanting a plurality of source regions in said body regions with ions of said n-type conductivity followed by removing said source blocking mask; and (g) forming an insulation layer and applying a high temperature process for densification of said insulation layer and further for actuating a diffusion of said-source regions and said deep heavily-doped body-dopant regions wherein said buried body-dopant regions are formed immediately below said source regions whereby said device ruggedness is improved.

8. The method for fabricating a MOSFET transistor of claim 3 wherein:

said step of depositing said blocking-and-alignment layer with said predetermined thickness is a step of depositing a silicon nitride layer with said predetermined thickness.

9. The method for fabricating a MOSFET transistor of claim 1 wherein:

said step of depositing a blocking-and-alignment layer of dielectric materials with a predetermined thickness in said step (e) is a step of forming said blocking-and-alignment layer over edges of said gates thus said blocking-and-alignment layer being formed with a total thickness of a thickness of said gate and said predetermined thickness over said edges of said gates whereby said blocking-and-alignment layer can block and align implanting ions over said gates and said edges of said gates while allowing implanting ions to enter into said substrate over said blocking-and-alignment layer between said gates.

10. The method for fabricating a MOSFET transistor of claim 1 wherein:

said step of removing said blocking-and-alignment layer in said step (e) is a step of removing entire layer without leaving side wall spacers over edges of said gates whereby an an-isotropic etching process can be avoided.

11. The method for fabricating a MOSFET transistor of claim 1 wherein:

said step (e) of depositing a blocking-and-alignment layer of dielectric materials immediately followed by implanting body-dopants of said second conductivity type over said blocking-and-alignment layer between said gates to form a buried body-dopant region disposed immediately below said source region is a step of forming said buried body-dopant region including a higher concentration of body-dopant ions than said body regions.

12. The method for fabricating a MOSFET transistor of claim 1 wherein:

said step of implanting body-dopants of said second conductivity type to form a buried body-dopant region in each of said body regions at a predetermined depth in said step (e) further includes a step of applying an elevate temperature to drive in said buried body-dopant region to a buried body-dopant region drive-in depth shallower than a depth of said body region before said step of applying a source blocking mask for implanting a plurality of source regions in said body regions in said step (f).

* * * * *